United States Patent [19]

Onishi

[11] 4,264,965
[45] Apr. 28, 1981

[54] DUMMY CELL STRUCTURE FOR MIS DYNAMIC MEMORIES

[75] Inventor: Yoshiaki Onishi, Kokubinji, Japan
[73] Assignee: Hitachi, Ltd., Japan
[21] Appl. No.: 83,660
[22] Filed: Oct. 11, 1979
[30] Foreign Application Priority Data Oct. 27, 1978 [JP] Japan .................. 53/131658

[51] Int. Cl.³ ............................. G11C 11/40
[52] U.S. Cl. ................. 365/210; 307/238.5;
365/174
[58] Field of Search ........ 365/174, 182, 210;
307/238

[56] References Cited
U.S. PATENT DOCUMENTS 4,195,357 3/1980 Kuo et al. ................ 365/210

Primary Examiner—Terrell W. Fears
Attorney, Agent, or Firm—Craig and Antonelli

[57] ABSTRACT

A structure of a dummy cell of a one-transistor cell type dynamic RAM made up of MISFETs formed in the shape of an integrated circuit within a single semiconductor substrate, the dummy cell structure comprising a pair of first gate electrode layers which is made of a first polycrystalline silicon layer, a second gate electrode layer which is made of a second polycrystalline silicon layer formed on the semiconductor substrate between the pair of first gate electrode layers through a gate insulating film, means for applying a fixed bias voltage to the second gate electrode layer in order to operate it as a capacitor, means for applying a clear control signal to one of the pair of first gate electrode layers in order to operate it as a clearing MISFET, and means for applying a word select signal to the other first gate electrode layer in order to operate it as a transfer MISFET.

3 Claims, 10 Drawing Figures

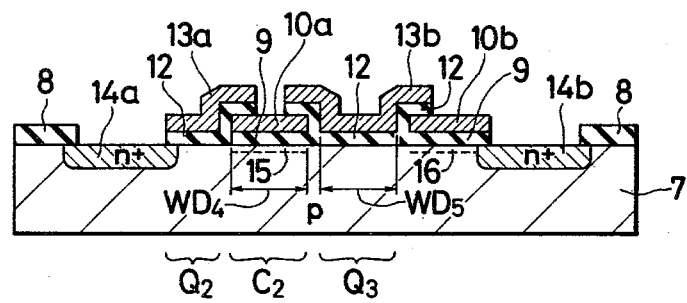
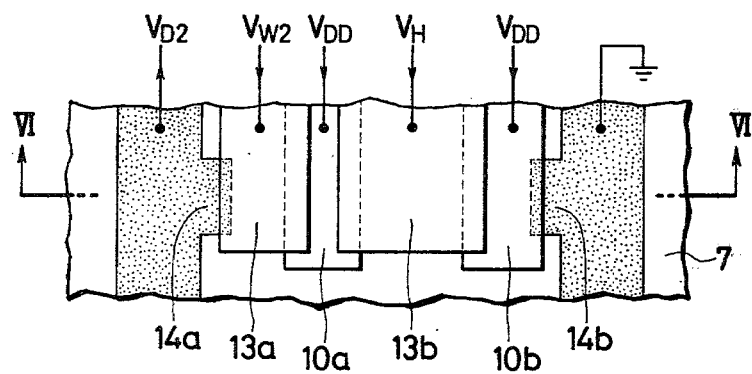

DUMMY CELL STRUCTURE FOR MIS DYNAMIC MEMORIES

BACKGROUND OF THE INVENTION

This invention relates to the integrated circuit structure of the dummy cell of a dynamic random access memory (RAM) employing an insulated gate type field effect transistor (hereinbelow, simply termed "MISFET"). More particularly, it relates to the structure of a dummy cell for use in a one-transistor cell memory.

A dynamic RAM which employs the so-called one-transistor memory cell or one-device memory cell consisting of one MISFET and one capacitor has been well known as stated in, for example, the literature "IEEE Journal of Solid-State Circuits, Vol. SC-10, No. 5, pp. 255–261, Oct. 1975" and "Electronics, Apr. 28, 1977, pp. 115–119". The fundamental circuit of this dynamic RAM is shown in FIG. 1.

The circuit includes a memory cell $CELL_1$ which consists of a capacitor $C_1$ for storing an information therein and a MISFET $Q_1$ for transferring the information; a dummy cell $CELL_2$ which consists of a capacitor $C_2$, a transfer MISFET $Q_2$ and a clearing MISFET $Q_3$ and which serves to apply a reference potential for reading out the information; and a pre-amplifier or sense amplifier PA of the flip-flop type.

FIG. 2 is an operating waveform diagram of the circuit in FIG. 1. In operation, the clearing MISFET $Q_3$ of the dummy cell $CELL_2$ is turned "on" by the high level of a control voltage $V_H$, thereby to discharge charges in the capacitor $C_2$. Thereafter, when the level of the control voltage $V_H$ has become a level (low level) which turns the MISFET $Q_3$ "off", word signals $V_{w1}$ and $V_{w2}$ of high level are respectively applied to word lines $W_1$ and $W_2$ so as to turn "on" both the MISFETs $Q_1$ and $Q_2$. Thus, the level $V_{D1}$ of a digit line $D_1$ to which the memory cell $CELL_1$ is connected is brought to a level ($D_H$ or $D_L$) corresponding to the information "1" or "0" stored in the capacitor $C_1$ of the memory cell, while the level $V_{D2}$ of a digit line $D_2$ to which the dummy cell $CELL_2$ is connected is brought to the intermediate level E (reference voltage level) between the high level $D_H$ and low level $D_L$ of the digit line $D_1$. As a result, the preamplifier PA is latched according to the levels of the digit lines $D_1$ and $D_2$ and delivers a certain read-out signal level of "high" or "low" to the digit line $D_1$ or $D_2$ because it is constructed of the flip-flop type amplifier.

In case of fabricating such dynamic RAM in the form of an integrated circuit within a single silicon substrate, the dummy cell $CELL_2$ has heretofore been put into a structure as shown in FIG. 3.

A supply voltage $V_{DD}$ is applied to a gate electrode 3, to form an n-type inversion layer 6 in the surface of a p-type semiconductor substrate 1 through a gate insulating film 2. Thus, the capacitor $C_2$ is constructed between the gate electrode 3 and the inversion layer 6. The clearing MISFET $Q_3$ is constructed in such a manner that a gate electrode 4b for applying the clear control signal $V_H$ is formed on the surface of the semiconductor substrate 1 between the inversion layer 6 and a semiconductor region 5b connected with the ground point of the circuit. The transfer MISFET $Q_2$ is constructed in such a manner that a gate electrode 4a for applying the signal $V_{w2}$ synchronized with the word line select signal $V_{w1}$ is formed on the surface of the semiconductor substrate 1 between the inversion layer 6 and a semiconductor region 5a connected with the digit line $D_2$.

The inventor, however, has revealed that the following problem is involved in the dynamic RAM having the prior-art dummy cell structure as described above.

In the structure of FIG. 3, a channel capacitance $C_3$ is parasitically formed between the inversion layer 6 and the gate electrode 4b, and at the transition of the potential $V_H$ of the gate electrode 4b from the high level to the low level, the clear level at one end F of the capacitor $C_2$ changes due to the capacitive coupling of the parasitic capacitance $C_3$. Letting V denote the transition voltage of the gate electrode 4b, the variation $\Delta V$ at the end F of the capacitor $C_2$ is obtained by the following equation:

$$\Delta V = -\frac{C_3}{C_2 + C_3} V$$

Accordingly, the quantity of charges which is delivered from the digit line $D_2$ to the capacitor $C_2$ when the MISFET $Q_2$ has turned "on" at the read-out changes due to the capacitance $C_3$. Therefore, the reference voltage level for the read-out which is given to the digit line $D_2$ is dependent upon the capacitance $C_3$.

On the other hand, when the dummy cell is manufactured into the form of the integrated circuit, errors of mask-alignment in the manufacturing process are unavoidable. It is therefore inevitable that, in forming the gate electrode 3 of the first layer and the gate electrodes 4a and 4b of the second layer, the surface area by which the gate electrode 4b opposes to the semiconductor substrate 1 through the gate insulating film 2 changes on account of the error of mask-alignment between masks for forming the gate electrodes of the first and second layers. For this reason, the value of the parasitic capacitance $C_3$ deviates, and the read-out reference voltage level of the digit line $D_2$ has a small margin for the read-out level of the high or low level.

SUMMARY OF THE INVENTION

It is therefore an object of this invention to provide a dummy cell structure for making the parasitic capacitance of the clearing MISFET of a dummy cell a fixed value in order to realize a dynamic RAM of high reliability free from malfunctions.

In accordance with the dummy cell structure of this invention, there are formed a pair of first gate electrode layers which extend on a gate insulating film of a semiconductor substrate in parallel to each other with a predetermined spacing therebetween. A second gate electrode layer is formed on the area of the gate insulating film of the semiconductor substrate between the pair of first gate electrode layers in a manner to overlap the first gate electrode layers. Using the first and second gate electrode layers as an impurity-introducing mask, the semiconductor is introduced with an impurity to form therein an impurity-introduced region which extends from an end part of one of the pair of first gate electrode layers. In the structure thus fabricated, either the other first gate electrode layer or the second gate electrode layer has a fixed bias voltage ($V_{DD}$) applied thereto and is used for a capacitor, while the other has a clear control signal ($V_H$) applied thereto and is used for a clearing MISFET.

In this way, the capacitance of the dummy cell and the effective area of the gate electrode of the clearing MISFET can be uniquely stipulated by the layout dimensions of the pair of first gate electrode layers.

The above-mentioned and other objects and advantages of this invention will become more apparent from the following description taken with reference to the drawings.

BRIEF DESCRIPTION OF THE DRAWINGS

FIGS. 6 and 7 are a sectional view and a plan view, respectively, of a dummy cell structure showing another embodiment of this invention.

DESCRIPTION OF THE PREFERRED EMBODIMENTS

Figure 4A:
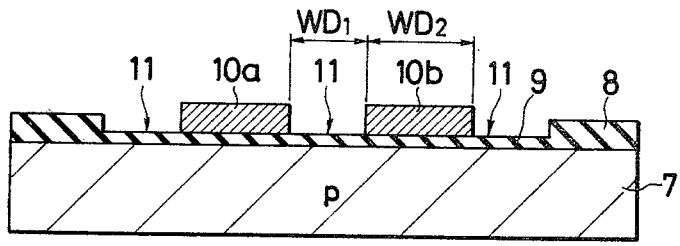
FIGS. 4A–4D are sectional views showing a dummy cell structure according to this invention to be employed for a dynamic RAM, in various steps of the manufacturing process of the structure.
Figure 4B:
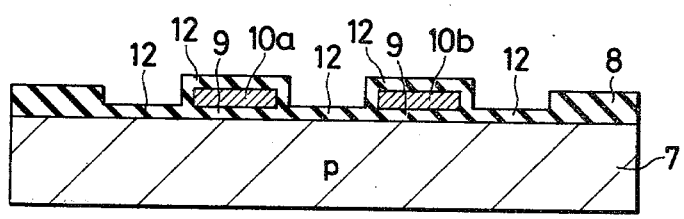
Figure 4C:
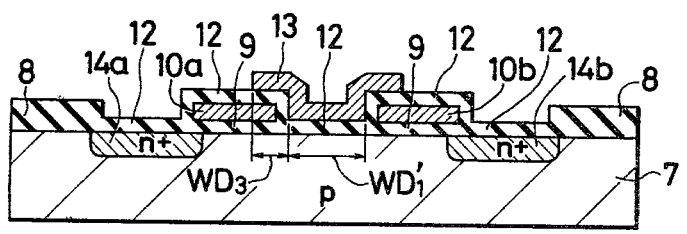
Figure 4D:
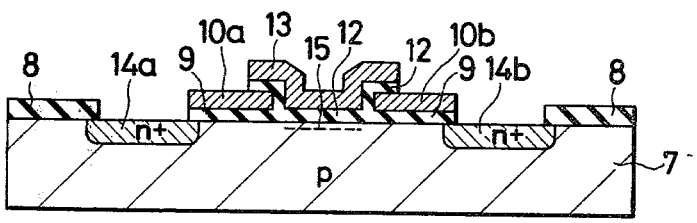
Figure 5:
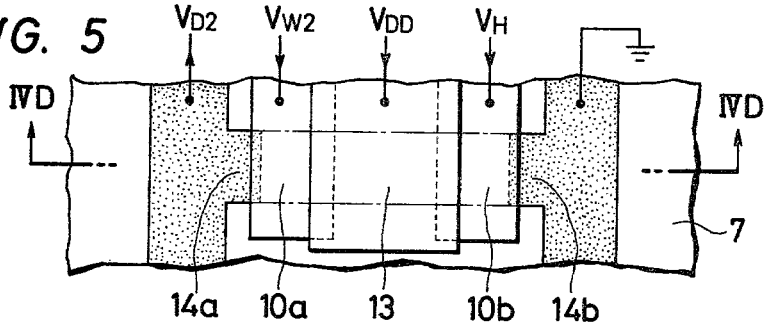
FIG. 5 is a plan view of the dummy cell structure according to this invention illustrated in FIG. 4D.

FIG. 4D is a sectional view showing the structure of a dummy cell which is employed in an N-channel silicon gate MIS dynamic RAM according to this invention, while FIG. 5 is a plan view corresponding to FIG. 4D.

In FIGS. 4D and 5, numeral 7 designates a silicon semiconductor substrate, in which a large number of MISFETs constituting the RAM other than the dummy cell are formed though not shown. Numeral 8 designates a thick field insulating film, and numerals 9 and 12 designate thin gate insulating films. Symbols 10a and 10b indicate first gate electrode layers of polycrystalline silicon which are simultaneously formed on the gate insulating film 9, while numeral 13 indicates a second gate electrode layer of polycrystalline silicon which is formed on the gate insulating film 12. Shown at 14a and 14b are n-type semiconductor regions which are formed in such a way that an n-type impurity is introduced by exploiting the gate electrode layers 10a and 10b parts of a mask and also exploiting the field insulating film 8 as another part of the mask.

Now, the manufacturing process of this dummy cell structure will be explained.

Referring to FIG. 4A, the thick field insulating film 8 made of a silicon oxide is formed on the p-type silicon semiconductor substrate 7. The insulating film 8 in an area in which the dummy cell is to be formed is selectively removed, and the thin gate insulating film 9 which is made of a silicon oxide and which is, for example, 1,000 angstroms thick is formed on the area. A polycrystalline silicon layer which contains an n-type impurity therein is formed in a manner to cover the gate insulating film 9 as well as the field insulating film 8. Using a predetermined mask, the polycrystalline silicon layer is partially etched to form the two spaced gate electrode layers 10a and 10b which have a predetermined shape.

At this time, the spacing $WD_1$ between the gate electrode layers 10a and 10b and the width $WD_2$ of the gate electrode layer 10b are uniquely stipulated in accordance with the pattern of the predetermined mask, so that they do not deviate among products. The gate electrode layer 10b is used as the gate electrode of a clearing MISFET $Q_3$, and the width $WD_1$ between the gate electrode layer 10a and the gate electrode layer 10b stipulates the width of a gate electrode for obtaining a capacitor $C_2$.

At the next step, using the gate electrode layers 10a and 10b as a mask, those parts 11 of the thin gate insulating film which are exposed outside the gate electrode layers are removed. Thereafter, as shown in FIG. 4B, a layer 12 of the silicon oxide is formed in the surfaces of the exposed parts and the gate electrode layers 10a and 10b by heat treatment again. At this time, the part of the silicon oxide layer 12 which overlies the semiconductor substrate 7 between the gate electrode layers 10a and 10b has a small thickness similar to that of the gate insulating film 9 so as to bestow the stipulated capacitance value of the capacitor $C_2$. Those parts of the silicon oxide layer 12 which overlie the gate electrode layers 10a and 10b function as an inter-layer insulating film for the second polycrystalline silicon layer to be formed later.

Subsequently, as shown in FIG. 4C, the second polycrystalline silicon layer 13 which overlaps the gate electrodes 10a and 10b is selectively formed in a manner to extend on the surface of the part of the insulating film 12 between the gate electrodes 10a and 10b and on the surfaces of the parts of the insulating film 12 overlying the gate electrodes 10a and 10b.

This second polycrystalline silicon layer 13 functions as the gate electrode for the capacitor $C_2$. The capacitance value of the capacitor $C_2$ is uniquely stipulated by the width $WD_{1'}$ of that part of the polycrystalline silicon layer 13 which is deposited on the insulating film 12 existent between the gate electrodes 10a and 10b. Therefore, even when the overlap width $WD_3$ between the gate electrode 10a (or 10b) and the gate electrode 13 has deviated on account of the misalignment between the mask for forming the first gate electrode layers and the mask for forming the second gate electrode layer, the deviation of the capacitance value can be suppressed.

Thereafter, as shown in FIG. 4D, using the gate electrodes 10a, 10b and 13 as a mask, the thin insulating film 12 is removed to expose the surface of the semiconductor substrate 7, whereupon using the field insulating film 8, the gate electrodes 10a and 10b and the polycrystalline silicon layer 13 as the mask, the semiconductor substrate 7 and the polycrystalline silicon layer 13 are introduced with the n-type impurity to form the semiconductor regions 14a and 14b and the conductive polycrystalline silicon layer 13 which is the second-layer gate electrode.

In the dummy cell structure in FIGS. 4D and 5 thus obtained, a control signal $V_{w2}$ synchronized with a word line select signal is applied to the gate electrode 10a, and a clear control signal $V_H$ is applied to the gate electrode 10b. A fixed bias voltage $V_{DD}$ for forming a n-type inversion layer 15 is applied to the gate electrode 13.

Figure 1:
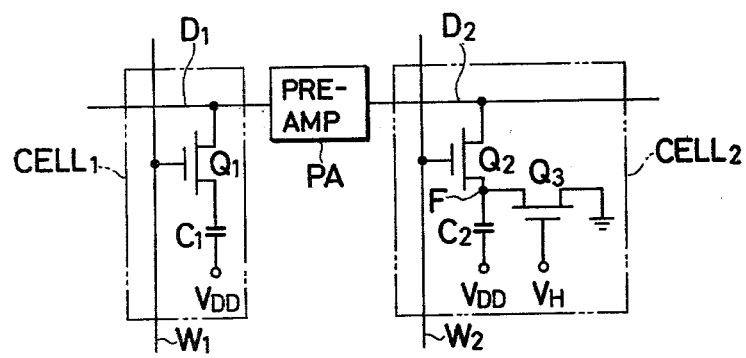
FIG. 1 is a circuit diagram of a dynamic RAM which is constructed of a well-known one-transistor (one-MISFET) memory cell.
Figure 2:
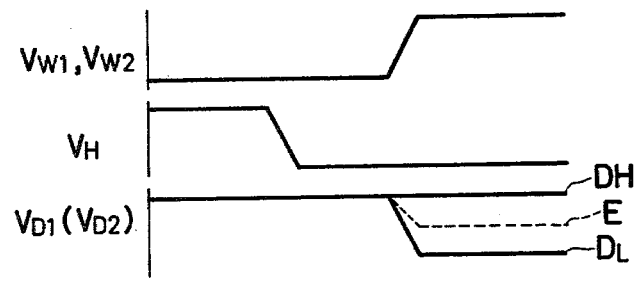
FIG. 2 is a waveform diagram for explaining the operation of the circuit in FIG. 1.
Figure 3:
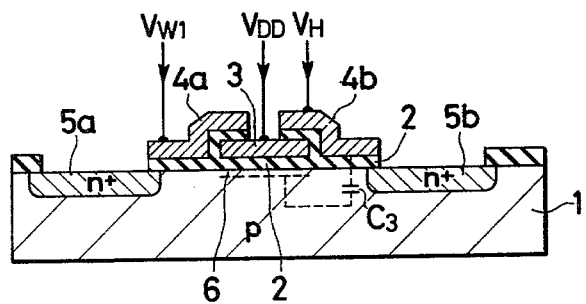
FIG. 3 is a sectional view showing the structure of a well-known dummy cell which is employed for the dynamic RAM in FIG. 1.

In other words, the gate electrode 10a is operated as the gate of the transfer MISFET $Q_{2c}$(FIG. 1), and the gate electrode 10b as the gate of the clearing MISFET $Q_3$. Further, the gate electrode 13 is operated as one electrode of the capacitor $C_2$.

In accordance with such dummy cell structure, the area by which the gate electrode 10b constituting the clearing MISFET $Q_3$ opposes to the semiconductor substrate 7 through the gate insulating film 9 is prescribed by only the mask for forming the gate electrodes 10a and 10b of the first layer and corresponds to the width $WD_2$ of the gate electrode 10b. The substantial gate area by which the gate electrode 13 of the second layer opposes to the semiconductor substrate 7 through the gate insulating film 12 is prescribed by the spacing $WD_1$ between the gate electrodes 10a and 10b of the first layer, in other words, by the mask for forming the gate electrodes 10a and 10b of the first layer. Therefore, the misalignment between the respective masks for forming the gate electrodes 10a and 10b of the first layer and for forming the gate electrode 13 of the second layer develops only in the portion in which both the gate electrodes overlap, in a manner to cause the width $WD_3$ of the overlap to deviate. As a result, the value of a parasitic capacitance $C_3$ becomes constant irrespective of the mask-alignment.

In the dummy cell structure, accordingly, the capacitance of the capacitor $C_2$ etc. can be set in consideration of the fact that the value of the parasitic capacitance $C_3$ is fixed. In consequence, a fixed reference potential is obtained at a digit line $D_2$ to which the dummy cell is connected. This makes it possible to provide a RAM which has a large read-out margin and which is less prone to malfunctions.

Although the structure of the memory cell ($CELL_1$) has not been referred to in the description of this embodiment, the capacitor $C_1$ of the memory cell is constructed by utilizing the second polycrystalline silicon layer for the gate electrode likewise to the capacitor $C_2$ of the dummy cell, while the gate electrode of the transfer MISFET $Q_1$ of the memory cell is formed by employing the first polycrystalline silicon layer likewise to that of the MISFET $Q_2$ of the dummy cell.

FIGS. 6 and 7 are a sectional view and a plan view, respectively, of a dummy cell structure showing another embodiment of this invention. In these figures, parts which can be formed according to the same process as explained with reference to FIGS. 4A–4D are assigned the same reference numerals.

In FIGS. 6 and 7, numeral 7 indicates a silicon semiconductor substrate, numeral 8 a thick field insulating film, numerals 9 and 12 thin gate insulating films, symbols 10a and 10b gate electrodes of the first layer, symbols 13a and 13b gate electrodes of the second layer, and symbols 14a and 14b n-type semiconductor regions. Such structure is fabricated by a process similar to that described with reference to FIGS. 4A–4D.

In this embodiment, the gate electrode 10b between those 10a and 10b of the first layer has applied thereto a bias voltage $V_{DD}$ for forming an n-type inversion layer 16, which is used as the source region of a MISFET $Q_3'$ while the gate electrode 10a has applied thereto the bias voltage $V_{DD}$ for forming an n-type inversion layer 15 in order to obtain a capacitor $C_2$. The gate electrode 13b of the second layer formed between the gate electrodes 10a and 10b is used as the gate electrode of the clearing MISFET $Q_3$ and has a clear control signal $V_H$ applied thereto, while the gate electrode 13a of the second layer is used as the gate electrode of a transfer MISFET $Q_2$ and has applied thereto a signal $V_{w2}$ synchronized with a word line select signal.

In this embodiment, the substantial area of the gate electrode of the MISFET $Q_3$ is stipulated by the spacing between the gate electrodes 10a and 10b of the first layer, while the gate electrode 10a for realizing the capacitor $C_2$ is stipulated by the mask itself for forming the gate electrode of the first layer.

Accordingly, the width $WD_4$ of the gate electrode for the capacitor and the width $WD_5$ of the gate electrode for the clearing MISFET become constant among products or among dummy cells in an identical product, so that the capacitances $C_2$ and $C_3$ can be made constant among the products or among the dummy cells. As in the first embodiment, therefore, a stable reference voltage level can be bestowed on a digit line $D_2$ with which the dummy cell is connected.

As apparent from the foregoing embodiments of this invention, in accordance with this invention, the dummy cells having the fixed parasitic capacitance ($C_3$) can be produced among the dummy cells in an identical product or among products, so that balanced reference voltage levels for read-out can be supplied to the pair of digit lines of the pre-amplifier and that the deviations of the reference voltage levels among the products can also be prevented. It is accordingly possible to provide a dynamic RAM of high reliability which undergoes few malfunctions ascribable to noise etc.

This invention is not restricted to the embodiments stated above, but by way of example the gate electrode can be formed of a layer of metal such as aluminum and molybdenum instead of the polycrystalline silicon layer. This invention can have various modifications within a scope not departing from the spirit thereof.

I claim:

1. In a dummy cell for use in a dynamic RAM which includes a memory cell and the dummy cell formed in the shape of an integrated circuit within a single semiconductor substrate, the dummy cell having a capacitor and a first insulating gate type field effect transistor connected to one end of the capacitor and serving to discharge charges stored in the capacitor;

a dummy cell comprising:

a first insulating layer which is formed on a major surface of said semiconductor substrate;

a pair of first gate electrode layers which are formed on said first insulating layer in a manner to extend in parallel with a predetermined spacing therebetween;

a second insulating layer which is formed on the major surface of said semiconductor substrate between said pair of first gate electrode layers and on surfaces of said first gate electrode layers;

a second gate electrode layer which is formed on said second insulating layer overlying said major surface of said semiconductor substrate between said pair of first gate electrode layers;

an impurity-introduced semiconductor region which is formed in said semiconductor substrate by employing said pair of first gate electrode layers and said second gate electrode layer as an impurity introducing mask, which extends from an end part of one of said pair of first gate electrode layers and which has a conductivity type opposite to that of said semiconductor substrate;

means for applying a fixed bias voltage to one of the other first gate electrode layer and said second gate electrode layer in order to operate it for said capacitor; and means for applying a discharge control signal to the other of said other first gate electrode layer and said second gate electrode layer in order to operate if for said first insulated gate type field effect transistor.

2. A dummy cell according to claim 1, wherein the fixed bias voltage is applied to said other first gate electrode layer in order to operate it for said capacitor, while the discharge control signal is applied to said second gate electrode layer in order to operate it for said first insulated gate type field effect transistor, and wherein a fixed bias voltage is applied to said one of said first gate electrode layers, and an inversion layer which is thus formed in the major surface of said semiconductor substrate directly under the one gate electrode layer is operated as an output electrode of said first insulated gate type field effect transistor.

3. A dummy cell according to claim 1, wherein the fixed bias voltage is applied to said second gate electrode layer in order to operate it for said capacitor, while the discharge control signal is applied to said other first gate electrode layer in order to operate it for said first insulated gate type field effect transistor, and wherein a control signal synchronized with a certain word select signal is applied to said one of said first gate electrode layers to operate it for a second insulated gate type field effect transistor.

* * * * *